United States Patent [19]

Harita et al.

[11] 4,294,908
[45] Oct. 13, 1981

[54] PHOTORESIST COMPOSITION CONTAINING MODIFIED CYCLIZED DIENE POLYMERS

[75] Inventors: Yoshiyuki Harita, Kawasaki; Yoichi Kamoshida, Yokohama; Kunihiro Harada, Machida, all of Japan

[73] Assignee: Japan Synthetic Rubber Co., Ltd., Tokyo, Japan

[21] Appl. No.: 136,477

[22] Filed: Apr. 2, 1980

[30] Foreign Application Priority Data

Apr. 24, 1979 [JP] Japan ................................. 54-50694

[51] Int. Cl.³ ................................................ G03C 1/68
[52] U.S. Cl. ............................. 430/286; 204/159.14; 204/159.22; 430/287; 430/288
[58] Field of Search ...................... 204/159.14, 159.22; 430/286, 287, 288

[56] References Cited

U.S. PATENT DOCUMENTS 3,808,155  4/1974  Broyde ................................. 430/287
3,842,019  10/1974  Kropp ................................. 430/287
3,948,667  4/1976  Ichikawa et al. .................. 430/286

*Primary Examiner*—Jack P. Brammer
*Attorney, Agent, or Firm*—Oblon, Fisher, Spivak, McClelland & Maier

[57] ABSTRACT

A photoresist composition comprising a cyclized product obtained by contacting a conjugated diene polymer or copolymer having unsaturations in the main chain or side chains with a fluorine-containing substituted sulfonic acid compound represented by the formula:

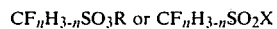

$$CF_nH_{3-n}SO_3R \text{ or } CF_nH_{3-n}SO_2X$$

wherein R is hydrogen, alkyl or $CF_nH_{3-n}SO_2$, X is halogen, and n is 1, 2 or 3, in an inert solvent, and a photosensitive crosslinking agent soluble in an organic solvent. The resist pattern obtained from said composition has excellent heat resistance. Also, when a silicon oxide film having said resist pattern is etched, the number of pinholes formed is very small.

15 Claims, No Drawings

PHOTORESIST COMPOSITION CONTAINING MODIFIED CYCLIZED DIENE POLYMERS

This invention relates to a photoresist composition, and more particularly to a photoresist composition comprising a cyclized product obtained by contacting a conjugated diene polymer or copolymer (hereinafter referred to as conjugated diene polymer) having unsaturations in the main chain or side chains with a fluorine-containing substituted sulfonic acid or a derivative thereof, and a photosensitive crosslinking agent soluble in an organic solvent.

There are commercially available two types of negative photoresist compositions: one type using a polyvinyl cinnamate resin as the base material and the other type using cyclized polyisoprene or natural rubber as the base material. Of these compositions, negative photoresist compositions in which cyclized polyisoprene is used as the base material are most widely used because of their high resolving power and acid resistance. However, the conventional photoresist compositions in which cyclized polyisoprene or natural rubber is used as the base material were poor in heat resistance and the fine resist patterns formed from such compositions would be deformed when subjected to, for example, a heat treatment at a temperature above 180° C.

The present inventors have studied the cyclization reaction of polyisoprene with trifluoromethanesulfonic acid and have evaluated the cyclized polyisoprene as a photoresist and, as a result, have quite surprisingly found that the resist pattern formed by using such a cyclized polyisoprene is scarely deformed even when heat-treated at a temperature as high as 180° C., and have further surprisingly found that when a silicon oxide film having such a resist pattern is subjected to etching, it has much fewer pinholes than when a conventional photoresist is used.

According to this invention, there is provided a photoresist composition comprising a cyclized product obtained by contacting a conjugated diene polymer having unsaturations in the main chain or side chains with a fluorine-containing substituted sulfonic acid compound of the formula:

$$CF_nH_{3-n}SO_3R \text{ or } CF_nH_{3-n}SO_2X$$

wherein R is hydrogen, alkyl or $CF_nH_{3-n}SO_2$, X is halogen, and n is 1, 2 or 3, in an inert solvent, and a photosensitive crosslinking agent soluble in an organic solvent.

The conjugated diene polymer having unsaturations in the main chain or side chains, which is the starting material for the cyclized product of this invention, is selected from the conjugated diene polymers and copolymers having a structural unit represented by the following formula in the polymer chain:

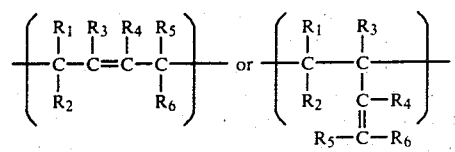

wherein $R_1$, $R_2$, $R_3$, $R_4$, $R_5$ and $R_6$ represent independently hydrogen, alkyl or aryl, preferably hydrogen, $C_{1-4}$ alkyl, such as methyl, ethyl, propyl, etc., or phenyl.

Examples of said units are cis-1,4-butadiene unit, trans-1,4-butadiene unit, cis-1,4-isoprene unit, trans-1,4-isoprene unit, cis-1,4-pentadiene unit, trans-1,4-pentadiene unit, 1,4-(2-phenyl)butadiene unit, 1,2-butadiene unit, 3,4-isoprene unit, 1,2-pentadiene unit, and 3,4-(2-phenyl)butadiene unit. The unsaturated monomers copolymerizable with these conjugated dienes include aromatic vinyl compounds such as styrene, α-methylstyrene and the like, and olefins such as ethylene, propylene, isobutylene, etc. Amont these conjugated diene polymers, preferable for use in this invention are those having the cis-1,4-isoprene unit, trans-1,4-isoprene unit or 3,4-isoprene unit, and the isoprene polymers are particularly preferable.

As the fluorine-containing substituted sulfonic acid compound employed as a catalyst for obtaining the cyclized product of this invention, there may be used fluoromethanesulfonic acid, difluoromethanesulfonic acid, trifluoromethanesulfonic acid and anhydrides, methyl esters, ethyl esters, and acid chlorides of these acids. Among them, trifluoromethanesulfonic acid, and its anhydride, methyl ester, ethyl ester and acid chloride are preferred. More preferred is trifluoromethanesulfonic acid.

The conjugated diene polymer is first dissolved in an inert solvent and then contacted with the fluorine-containing substituted sulfonic acid compound to cyclize said polymer. As the solvent in this cyclization operation, there may favorably be employed an inert hydrocarbon such as pentane, hexane, heptane, benzene, toluene, xylene, or the like or an inert halogenated hydrocarbon such as methylene dichloride, chlorobenzene, or the like.

As for the concentration of the conjugated diene polymer solution in the cyclization reaction, it is desirable to use as dilute a solution as possible because a selective intramolecular reaction is preferred for the cyclization reaction. Too high a solution concentration may cause gelation in the intramolecular reaction and hence is not desirable. The available range of concentration of the conjugated diene polymer solution cannot be specified sweepingly as it varies depending on the type of the conjugated diene polymer used and the cyclization reaction conditions. Generally, the conjugated diene polymer is used in a concentration within the range of about 0.5 to 10% by weight.

In the case of using a conjugated diene polymer with a low molecular weight as the starting material for cyclization, it is possible to obtain a desired cyclized product from a high-concentration polymer solution without causing gelation. Also, in the case of using a good solvent, the cylization reaction proceeds smoothly and gelation is reluctant to take place, so that it is possible to maintain a high concentration of the polymer solution, allowing efficient production of the desired cyclized product.

The amount of the fluorine-containing substituted sulfonic acid compound used for the production of the cyclized product of this invention is usually about 1/6000 to 1/10 moles, preferably about 1/5000 to 1/20 moles, per structural unit (repeating unit) of the conjugated diene polymer.

The cyclization reaction is usually carried out under normal pressure at a temperature ranging from 40° C. to the boiling point of the solvent used, but it can, of course, be performed under pressure. For instance, in the case of a xylene solvent, the reaction is usually carried out under normal pressure at a temperature of 60° C. to 120° C. This cyclization reaction proceeds very rapidly, and it is considered that the reaction is substantially completed immediately after the addition of the catalyst, and usually, almost no difference is seen in the degree of cyclization between the product of the 10-minute reaction and the product of the 1-hour reaction.

A stabilizer may be added to the cyclized product of this invention to make sure of perfect prevention of gelation, and usual antioxidants such as of phenol type, sulfide type, phosphite type or amine type may effectively be used as said stabilizer.

As the photosensitive crosslinking agent soluble in an organic solvent, which is the other essential component in this invention, there may be used azide type photosensitive materials such as 4,4'-diazidostilbene, p-phenylenebisazide, 4,4'-diazidobenzophenone, 4,4'-diazidodiphenylmethane, 4,4'-diazidocalcon, 2,6-bis-(4'-azidobenzal)cyclohexanone, 2,6-bis-(4'-diazidobenzal)-4-methylcyclohexanone, 4,4'-diazidodiphenyl, 4,4'-diazido-3,3'-dimethyldiphenyl and 2,7-diazidofluorene. However, the photosensitive crosslinking agents usuable in this invention are not limited to the above-mentioned materials but all known types of photosensitive crosslinking agents, which are effective when used in combination with the cyclized products of this invention, can be used. The photosensitive crosslinking agent is used in a ratio of 0.5 to 5 parts by weight to 100 parts by weight of the cyclized product.

Usually, a photoresist composition is dissolved in an organic solvent and used in the form of a solution after adjusting the viscosity of the composition. The photoresist composition of this invention is generally used in the form of a solution in a solvent.

The preparation of the composition of this invention and use of said composition as a photoresist are described below by way of a preferred embodiment. First, 0.5 to 5 parts by weight of a photosensitive crosslinking agent is added to 100 parts by weight of the cyclized product of this invention and the resulting mixture is dissolved in a suitable solvent such as benzene, toluene, xylene, or the like and if necessary, a sensitizer and a storage stabilizer are further added thereto to prepare a photoresist solution. As the sensitizer, there may be used carbonyl compounds such as benzophenone, anthraquinone, 1,2-naphthoquinone, 1,4-naphthoquinone, 2-methylanthraquinone, benzanthrone, violanthrone, 9-anthraldehyde, benzil, p,p'-tetramethyldiaminobenzophenone, chloranil, and the like; aromatic hydrocarbons such as anthracene, chrysene and the like; nitro compounds such as nitrobenzene, p-dinitrobenzene, 1-nitronaphthalene, p-nitrodiphenyl, 2-nitronaphthalene, 2-nitrofluorene, 5-nitroacenaphthene, and the like; nitrogen compounds such as nitroaniline, 2-chloro-4-nitroaniline, 2,6-dichloro-4-nitroaniline, 5-nitro-2-aminotoluene, tetracyanoethylene, and the like; sulfur compounds such as diphenyl disulfide and the like. As the storage stabilizer, there may be effectively used antioxidants such as of phenol type, sulfide type, phosphite type and amine type which are mentioned above as gelation inhibitor for said cyclized product. The solid content of the photoresist solution is preferably within the range of 5 to 30% by weight. The photoresist solution thus prepared is applied on a silicon wafer or metal-coated substrate by means of a spinner or other means to form a resist film. This resist film is covered with a mask having a predetermined pattern and then exposed to light from a suitable light source such as an ultra-high pressure mercury lamp, arc lamp, or the like, followed by development with a solvent to form a resist pattern. When this resist pattern is further subjected to a heat treatment at a temperature of 100° to 200° C. and the substrate is etched by using a suitable etchant or a plasma, there is provided a high-precision finely processed substrate usable for producing semiconductors, LSI or the like. In use of the photoresist composition of this invention, there takes place almost no deformation of the resist pattern even if it is subjected to a heat treatment for post-baking at a temperature as high as 180° C., so that it is possible to reduce the heat-treating time as compared with the heat-treatment at a low temperature. There can also be obtained an etched image with substantially no heat deformation of the resist pattern in etching by a plasma or other means. Further, the resist composition of this invention, when applied on a substrate, can minimize formation of pinholes, can improve the yield of products such as IC, LSI, and the like and also makes it possible to obtain a high-precision etched image with good reproducibility that has been unable to be obtained from the conventional photoresists.

The invention is explained in further detail below referring to Examples, but the invention is not limited to these Examples.

EXAMPLE 1

125 g of an isoprene polymer (cis: 98.6%; vinyl: 1.4%; $[\eta]^{30°}_{toluene}=4.70$ dl/g, number-average molecular weight $\overline{Mn}=47.8\times10^4$) was put into a 5-liter separable flask, and after nitrogen substitution, 2,375 g of xylene with no moisture was added under a nitrogen atmosphere. A stirrer was then mounted to the flask and the mixture was stirred for approximately 10 hours while heating the same at 80° C. in an oil bath to form a uniform solution. While maintaining the reaction system at 80° C., 4.5 millimoles of trifluoromethanesulfonic acid (1/408 mole per structural unit of the polymer) was added to the solution and the solution was stirred for 30 minutes as it was. About 1 liter of water was added with stirring and the oil bath was removed to leave the mixture cooled, thereby terminating the reaction. In order to prevent gelation of the product, 1.25 g of 2,6-di-tert-butyl-p-cresol was added and the product was poured into a large excess of methanol to precipitate the same, after which the precipitated product was recovered, washed with methanol and dried. The recovered cyclized product had the following properties: $[\eta]^{30°}_{C.toluene}=0.64$ dl/g; number-average molecular weight $\overline{Mn}=7.8\times10^4$; degree of unsaturation as determined from NMR=20%.

To 100 parts by weight of the thus obtained cyclized product was added 1 part by weight of 2,6-bis-(4'-azidobenzal)cyclohexanone, and the mixture was dissolved in xylene to a solid content of 12.0% by weight. The solution viscosity was 35.5 cp at 25° C. The photoresist solution thus obtained was applied on a silicon water so as to provide a coating of 1 μm in thickness by using a spinner and dried at a temperature of 80° to 90° C. for 15 minutes. The coating was exposed through a chromium mask for a resolution test to light from a 250 W ultra-high pressure mercury lamp to print an image. When the image was developed with Waycoat IC Developer (fraction of a petroleum distillate by P. A. Hunt Chemical Corp.) (the unexposed portion was dissolved away), it was possible to resolve even a pattern of 1.3 μm in line width. This image-bearing silicon wafer was subjected to a heat treatment in a convection oven at 180° C. for 30 minutes, and the image was then examined again. It was found that absolutely no change had occured even in images of 1.5–2.0 μm in line width.

EXAMPLE 2

The procedure of Example 1 was repeated, except that 125 g of an isoprene polymer (cis-1,4-content: 92.0%; $[\eta]^{30°}$ C.$_{toluene}$=1.74 dl/g; number-average molecular weight $\overline{Mn}$=24.0×10$^4$) and 0.4 millimole of trifluoromethanesulfonic acid were substituted for the isoprene polymer and the 4.5 millimoles of methanesulfonic acid (1/4596 mole per structural unit of the polymer), respectively, to obtain a cyclized product having the following properties: $[\eta]^{30°}$ C.$_{toluene}$=1.05 dl/g; number-average molecular weight $\overline{Mn}$=14.0×10$^4$; degree of unsaturation as determined from NMR=30%.

To 100 parts by weight of the cyclized product thus obtained was added 3 parts by weight of 2,6-bis-(4'-azidobenzal)cyclohexanone, and the mixture was dissolved in xylene to a solid content of 8.8% by weight. The solution viscosity was 34.5 cp at 25° C. The resulting photoresist solution was coated on a silicon wafer having a silicon oxide film so as to form a photoresist coating of 1 μm in thickness by using a spinner and then dried at a temperature of 80° to 90° C. for 15 minutes. This was followed by exposure to light from a 250 W ultra-high pressure mercury lamp through a chromium mask for a resolution test to print an image. When the image was developed with Waycoat IC Developer, even a pattern of 1.3 μm in line width could be resolved. This image-bearing silicon wafer was subjected to a heat treatment in a convection oven at 180° C. for 30 minutes and the image was examined again, whereby it was ascertained that there took place absolutely no change even in images of 1.5–2.0 μm in line width. Also, when the silicon oxide film was etched by using a buffer etchant consisting of 1 part by volume of 49% by weight hydrofluoric acid and 6 parts by volume of a 40% by weight aqueous solution of ammonium fluoride, the pinhole density in the etched film was not more than 3 pinholes/cm$^2$.

EXAMPLE 3

The same procedure and test as in Example 2 were repeated, except that 2,6-bis-(4'-azidobenzal)-4-methylcyclohexanone was substituted for the 2,6-bis-(4'-azidobenzal)cyclohexanone, to obtain a result as good as in Example 2.

EXAMPLE 4

The same procedure as in Example 1 was repeated, except that 125 g of an isoprene polymer (cis-1,4 content=92.0%; $[\eta]^{30°}$ C.$_{toluene}$=1.30 dl/g; number-average molecular weight $\overline{Mn}$=16.0×10$^4$) and 4.5 millimoles of trifluoromethanesulfyl chloride (1/408 mole per structural unit of the polymer) were substituted for the isoprene polymer and the trifluoromethanesulfonic acid, respectively, to obtain a cyclized product of the following properties: $[\eta]^{30°}$ C.$_{toluene}$=0.73 dl/g; number-average molecular weight $\overline{Mn}$=9.8×10$^4$; degree of unsaturation as determined from NMR=26%.

To 100 parts by weight of the cyclized product thus obtained was added 2 parts by weight of 2,6-bis-(4'-azidobenzal)cyclohexanone, and the mixture was dissolved in xylene to a solid content of 12.0% by weight. The solution viscosity was 35.3 cp at 25° C. The resulting photoresist solution was applied on a silicon wafer having a silicon oxide film by using a spinner so as to form a photoresist coating of 1 μm in thickness and then dried at a temperature of 80° to 90° C. for 15 minutes. The coated silicon wafer obtained was then exposed to light from a 250 W ultra-high pressure mercury lamp through a chromium mask for a resolution test to print an image. When the image was developed with Waycoat IC Developer, even a pattern of 1.3 μm in line width could be resolved. When this image-bearing silicon wafer was subjected to a heat treatment in a convection oven at 180° C. for 30 minutes and the image was examined again, it was found that absolutely no change had taken place even in images of 1.5–2.0 μm in line width.

COMPARATIVE EXAMPLE 1

The same procedure as in Example 1 was repeated, except that 12.5 g of tin tetrachloride, which is a known cyclization catalyst, was substituted for the trifluoromethanesulfonic acid, and the reaction was effected at a temperature of 120° C. for 300 minutes, to obtain a cyclized product of the following preperties: $[\eta]^{30°}$ C.$_{toluene}$=0.66 dl/g; number-average molecular weight $\overline{Mn}$=6.0×10$^4$; degree of unsaturation as determined from NMR=42%.

To 100 parts by weight of the cyclized product thus obtained was added 2 parts by weight of 2,6-bis-(4'-azidobenzal)cyclohexanone and the mixture was dissolved in xylene to a solid content of 12.0% by weight. The solution viscosity was 37.3 cp at 25° C. When an image was printed on a silicon wafer in the same way as in Example 1 by using the same photoresist solution, it was found that a pattern of 1.6 μm in line width could be resolved but a 30-minute heat treatment at 180° C. showed a change even in a pattern of 5 μm in line width.

EXAMPLE 5

The same procedure as in Example 1 was repeated, except that 125 g of an isoprene polymer (cis-1,4 content 92.0%; $[\eta]^{30°}$ C.$_{toluene}$=1.74 dl/g; number-average molecular weight $\overline{Mn}$=24.0×10$^4$) and 0.3 millimole of trifluoromethanesulfonic anhydride (1/3063 mole per structural unit of the polymer) were substituted for the isoprene polymer and the trifluoromethanesulfonic acid, respectively, to obtain a cyclized product having the following properties: $[\eta]^{30°}$ C.$_{toluene}$=0.95 dl/g; number-average molecular weight $\overline{Mn}$=13.1×10$^4$; degree of unsaturation as determined from NMR=22%.

To 100 parts by weight of the cyclized product thus obtained was added 3 parts by weight of 2,6-bis-(4'-azidobenzal)cyclohexanone, and the resulting mixture was dissolved in xylene to a solid content of 9.3% by weight. The solution viscosity was 34.8 cp at 25° C. The resulting photoresist solution was applied on a silicon wafer having a silicon oxide film by using a spinner so as to form a photoresist coating of 1 μm in thickness, and dried at a temperature of 80° to 90° C. for 15 min. This was exposed to light from a 250 W ultra-high pressure mercury lamp through a chromium mask for a resolution test to print an image. When the image was developed with Waycoat IC Developer, even a pattern of 1.3 μm in line width could be resolved. When this image-bearing silicon wafer was subjected to a heat treatment in a convection oven at 180° C. for 30 minutes and the image was examined again, it was found that absolutely no change had taken place even in images of 1.5–2.0 μm in line width. Furthermore, when the silicon oxide film was etched by using a buffer etchant consisting of 1 part by volume of 49% by weight hydrofluoric acid and 6 parts by volume of a 40% aqueous ammonium fluoride solution, the film had a pinhole density of not more than 3 pinholes/cm².

EXAMPLE 6

The same procedure as in Example 1 was repeated, except that 125 g of a styrene-isoprene copolymer (styrene content 15% by weight; $[\eta]^{30°}$ C.$_{toluene}$=1.54 dl/g; number-average molecular weight Mn=20.6×10⁴) and 0.4 millimole of trifluoromethanesulfonic acid (1/3906 mole per structural unit of the polymer) were substituted for the isoprene polymer and the 4.5 millimoles of trifluoromethanesulfonic acid, respectively, to obtain a cyclized product having the following properties: $[\eta]^{30°}$ C.$_{toluene}$=0.85 dl/g; number-average molecular weight Mn=12.2×10⁴; degree of unsaturation as determined from NMR=30%.

To 100 parts by weight of the cyclized product thus obtained was added 3 parts by weight of 2,6-bis-(4'-azidobenzal)-4-methylcyclohexanone, and the resulting mixture was dissolved in xylene to a solid content of 10.2% by weight. The solution viscosity was 34.2 cp at 25° C. The resulting photoresist solution was applied on a silicon wafer having a silicon oxide film by a spinner so as to form a photoresist coating of 1 μm in thickness, and then dried at a temperature of 80° to 90° C. for 15 minutes. This was exposed to light from a 250 W ultra-high pressure mercury lamp through a chromium mask for a resolution test to print an image. When the image was developed with xylene, even an image of 1.5 μm in line width could be resolved. The image-bearing silicon wafer was subjected to a heat treatment in a convection oven at 180° C. for 30 minutes and the image was then examined again, it was found that absolutely no change had taken place even in images of 1.5-2.0 μm in line width. Moreover, when the silicon oxide film was etched by a buffer etchant consisting of 1 part by volume of 49% by weight hydrofluoric acid and 6 parts by volume of a 40% by weight aqueous ammonium fluoride solution, the film had a pinhole density of not more than 3 pinholes/cm².

What is claimed is:

1. A photoresist composition comprising a cyclized product obtained by contacting a conjugated diene polymer or copolymer having sites of unsaturation in the main chain or side chains with a fluorine-containing substituted sulfonic acid compound of the formula:

wherein R is hydrogen, alkyl or $CF_nH_{3-n}SO_2$, X is halogen, and n is 1, 2 or 3, in an inert solvent, and a photosensitive crosslinking agent soluble in an organic solvent.

2. A photoresist composition according to claim 1, wherein the amount of the photosensitive crosslinking agent is 0.5 to 5 parts by weight per 100 parts by weight of the cyclized product.

3. The photoresist composition according to claim 1 or 2, wherein the photosensitive crosslinking agent is an azido type photosensitive material.

4. The photoresist composition according to claim 3, wherein the azido type photosensitive material is 4,4'-diazidostilbene, p-phenylenebisazide, 4,4'-diazidobenzophenone, 4,4'-diazidodiphenylmethane, 4,4'-diazidocalcon, 2,6-bis-(4'-azidobenzal)cyclohexanone, 2,6-bis-(4'-azidobenzal)-4-methylcyclohexanone, 4,4'-diazidodiphenyl, 4,4'-diazido-3,3'-dimethyldiphenyl, or 2,7-diazidofluorene.

5. The photoresist composition according to claim 1 or 2, which further contains a sensitizer.

6. The photoresist composition according to claim 5, wherein the sensitizer is a carbonyl compound selected from the group consisting of benzophenone, anthraquinone, 1,2-naphthoquinone, 1,4-naphthoquinone, 2-methylanthraquinone, benzanthrone, violanthrone, 9-anthraldehyde, benzil, p,p'-tetramethyldiaminobenzophenone and chloranil; an aromatic hydrocarbon selected from the group consisting of anthracene and chrysene; a nitro compound selected from the group consisting of nitrobenzene, p-dintrobenzene, 1-nitronaphthalene, p-nitrodiphenyl, 2-nitronaphthalene, 2-nitrofluorene and 5-nitroacenapthene; a nitrogen compound selected from the group consisting of nitroaniline, 2-chloro-4-nitroaniline, 2,6-dichloro-4-nitroaniline, 5-nitro-2-aminotoluene and tetracyanoethylene; or diphenyl disulfide.

7. The photoresist composition according to claim 1 or 2, wherein said diene polymer having sites of unsaturation in the main chain or side chains is a conjugated diene polymer or copolymer having in the polymer chain units of the formula:

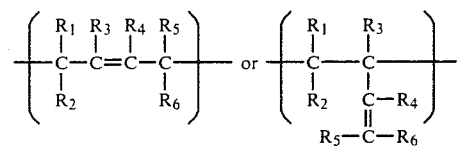

wherein $R_1$, $R_2$, $R_3$, $R_4$, $R_5$ and $R_6$ represent independently hydrogen, alkyl or aryl, and they may be the same or different.

8. The photoresist composition according to claim 1 or 2, wherein the conjugated diene polymer or copolymer contains cis-1,4-butadiene units, trans-1,4-butadiene units, cis-1,4-isoprene units, trans-1,4-isoprene units, cis-1,4-pentadiene units, trans-1,4-pentadiene units, 1,4-(2-phenyl)butadiene units, 1,2-butadiene units, 3,4-isoprene units, 1,2-pentadiene units or 3,4-(2-phenyl)-butadiene units.

9. The photosensitive composition according to claim 1 or 2, wherein the diene polymer or copolymer has cis-1,4-isoprene units, trans-1,4-isoprene units or 3,4-isoprene units.

10. The photoresist composition according to claim 1, wherein the fluorine-containing substituted sulfonic acid compound is fluoromethanesulfonic acid, difluoromethanesulfonic acid, trifluoromethanesulfonic acid or an anhydride, a methyl ester, an ethyl ester or an acid halide of the said acid.

11. The photoresist composition according to claim 1, wherein the fluorine-containing substituted sulfonic acid compound is trifluoromethanesulfonic acid or an anhydride, a methyl ester, an ethyl ester or an acid chloride of said acid.

12. The photoresist composition according to claim 1, wherein the amount of the fluorine-containing substituted sulfonic acid compound is 1/6000 to 1/10 moles per structural unit of the conjugated diene polymer.

13. The photoresist composition according to claim 11, wherein the amount of the fluorine-containing substituted sulfonic acid compound is 1/5000 to 1/20 moles per structural unit of the conjugated diene polymer.

14. The photoresist composition according to claim 1, wherein the cyclization reaction is carried out under normal pressure at a temperature ranging from 40° C. to the boiling point of the solvent used.

15. The photoresist composition according to claim 1 or 14, wherein the inert solvent is pentane, hexane, heptane, benzene, toluene, xylene, methylene dichloride or chlorobenzene.

* * * * *